(12) United States Patent
Schlenker et al.

(10) Patent No.: US 8,665,057 B2
(45) Date of Patent: Mar. 4, 2014

(54) ELECTRONIC ASSEMBLY HAVING STRESSABLE CONTACT BRIDGE WITH FUSE FUNCTION

(75) Inventors: Roberto Schlenker, Ingolstadt (DE); Michael Nagel, Nuremberg (DE); Juergen Martin, Ingolstadt (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 112 days.

(21) Appl. No.: 12/899,941

(22) Filed: Oct. 7, 2010

(65) Prior Publication Data

US 2011/0050386 A1    Mar. 3, 2011

Related U.S. Application Data

(63) Continuation-in-part of application No. 11/886,755, filed as application No. PCT/DE2006/000550 on Mar. 28, 2006, now Pat. No. 7,864,024.

(30) Foreign Application Priority Data

Mar. 31, 2005    (DE) .......................... 10 2005 014 601

(51) Int. Cl.
*H01H 85/36*    (2006.01)
*H01H 37/76*    (2006.01)

(52) U.S. Cl.
USPC ............ 337/407; 337/239; 337/401; 337/404

(58) Field of Classification Search
None
See application file for complete search history.

(56) References Cited

U.S. PATENT DOCUMENTS

| | | | |
|---|---|---|---|
| 2,790,049 A * | 4/1957 | McAlister ..................... | 337/405 |
| 3,763,454 A | 10/1973 | Zandonatti | |
| 4,047,143 A * | 9/1977 | Burden et al. ................ | 337/239 |
| 4,186,366 A | 1/1980 | McVey | |
| 4,441,093 A | 4/1984 | Okazaki | |
| 4,486,804 A * | 12/1984 | Watson et al. ................ | 361/104 |
| 4,527,144 A | 7/1985 | Arikawa | |
| 4,661,881 A * | 4/1987 | Watson et al. ................ | 361/104 |
| 5,014,036 A | 5/1991 | Komoto | |
| 5,153,805 A | 10/1992 | Tennant et al. | |
| 5,192,937 A | 3/1993 | Lee | |
| 5,280,262 A | 1/1994 | Fischer | |
| 5,311,164 A | 5/1994 | Ikeda et al. | |
| 5,550,527 A | 8/1996 | Lee | |
| 5,563,570 A | 10/1996 | Lee | |
| 5,600,295 A | 2/1997 | Kaufmann | |
| 5,612,662 A | 3/1997 | Drekmeier et al. | |
| 5,770,993 A * | 6/1998 | Miyazawa et al. ............ | 337/160 |
| 5,831,507 A | 11/1998 | Kasamatsu et al. | |

(Continued)

FOREIGN PATENT DOCUMENTS

| | | |
|---|---|---|
| DE | 20 58 357 | 6/1972 |
| DE | 75 20 602 | 10/1975 |

(Continued)

*Primary Examiner* — Anatoly Vortman
(74) *Attorney, Agent, or Firm* — W. F. Fasse

(57) ABSTRACT

An electronic circuit includes a conductor path on a circuit board, and at least one SMD component, electronic component and/or electromechanical component mounted on the circuit board and connected to the conductor path. A circuit connection is established via a soldered joint and a spring-loaded or stressed springy contact bridge that provides fuse protection. In the event of excessive power dissipation or high temperature, the soldered joint melts or softens and the contact bridge springs open to interrupt the circuit.

28 Claims, 3 Drawing Sheets

(56) References Cited

U.S. PATENT DOCUMENTS

| | | |
|---|---|---|
| 5,896,080 A | 4/1999 | Chen |
| 5,982,270 A | 11/1999 | Wolfe, Jr. et al. |
| 5,999,391 A | 12/1999 | Lou et al. |
| 6,088,234 A * | 7/2000 | Ishikawa et al. ............... 361/760 |
| 6,342,827 B1 | 1/2002 | Bührend et al. |
| 6,445,277 B1 | 9/2002 | Ishikawa et al. |
| 6,741,159 B1 | 5/2004 | Kuczynski |
| 7,002,785 B1 | 2/2006 | Bothe et al. |
| 7,023,674 B2 | 4/2006 | Gross et al. |
| 7,345,570 B2 | 3/2008 | Kawanishi |
| 7,471,498 B2 | 12/2008 | Lavene et al. |
| 2009/0027156 A1 | 1/2009 | Schlenker et al. |

FOREIGN PATENT DOCUMENTS

| | | |
|---|---|---|
| DE | 39 30 819 | 3/1991 |
| DE | 42 19 554 | 12/1993 |
| DE | 196 39 427 | 3/1997 |
| DE | 196 47 035 | 11/1997 |
| DE | 102004014660 | 7/2005 |
| JP | 09-306318 | 11/1997 |

* cited by examiner

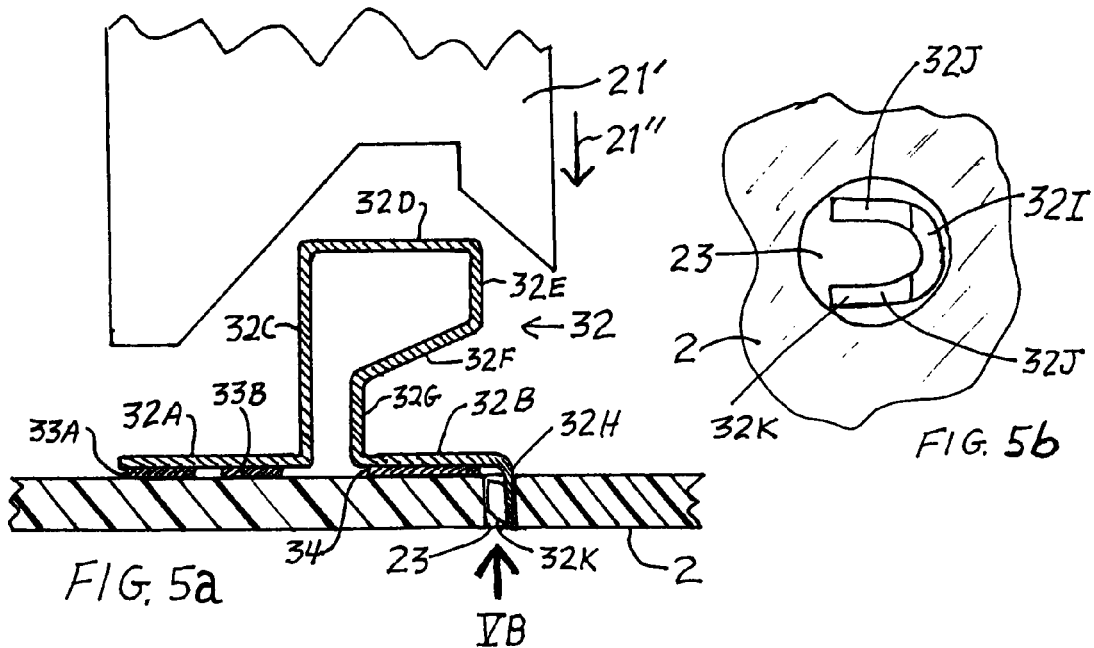
FIG. 5a
FIG. 5b
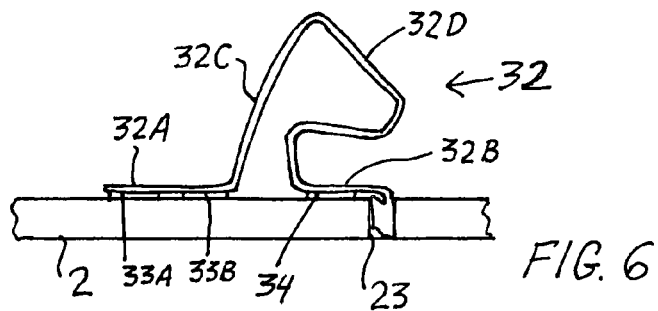
FIG. 6
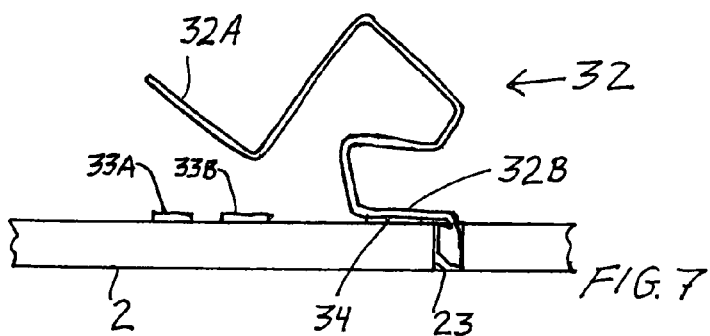
FIG. 7

ELECTRONIC ASSEMBLY HAVING STRESSABLE CONTACT BRIDGE WITH FUSE FUNCTION

CROSS-REFERENCE TO RELATED APPLICATIONS

This application is a Continuation-In-Part under 35 USC 120 of U.S. application Ser. No. 11/886,755 filed on Sep. 19, 2007, which is a US National Stage Application under 35 USC 371 of PCT International Application PCT/DE2006/000550 filed on Mar. 28, 2006. Through those prior applications, this application is also based on and claims the foreign priority under 35 USC 119 of German Patent Application 10 2005 014 601.5 filed on Mar. 31, 2005. The entire disclosure of each one of the above mentioned prior applications is incorporated herein by reference.

FIELD OF THE INVENTION

The invention relates to a stressable contact bridge with a fuse function for an electronic assembly with a circuit board that is provided with conductor strips or paths and, for forming an electronic circuit, is equipped with a number of SMD ("Surface Mounted Device") components and/or further electronic and/or electromechanical elements while using a suitable solder.

BACKGROUND INFORMATION

Such electronic assemblies can especially be provided for an application in electronic control devices, for example in driving dynamics regulators, ESP systems or ABS regulators. Depending on the application purpose, with such assemblies an unacceptably high loss power dissipation could arise in the assembly due to faulty components such as switching transistors for example, due to circuit board short circuits, or due to water penetration. In severe cases, this power dissipation could lead to the total destruction of the circuit board.

SUMMARY OF THE INVENTION

Therefore, an underlying object of the invention is to set forth an electronic assembly of the abovementioned type, which is secured to a high degree by simple means against a possible occurrence of high power dissipation.

This object is achieved according to the invention in that a number of connections between conductor strips, components and/or elements on the circuit board is provided respectively via a spring-loaded or springy stressable contact bridge or bail.

Thereby the invention begins from the consideration that an assembly secured to an especially high degree against the occurrence of a power dissipation should be designed for the most immediate as possible and the most automatic as possible suppression and elimination of the power-dissipating current. In that regard, in connection with the elevated temperatures arising due to the power dissipation, the increased power dissipation of defective components or the like, which contribute to the occurrence of fire, should be directly eliminated as quickly as possible. Therefore, for a rapid switching-off of the electrical current, a fuse should be provided, which interrupts the electrical connection between the affected conductor strips and/or components or elements in a sudden jump-like manner at elevated temperatures of for example more than about 180° C. In order to make this possible, the realization is utilized, that the solder materials used in the mounting of components or the like on the circuit board typically begin to melt upon the occurrence of such elevated temperatures. In order to make use of this for the abovementioned safety or fuse purposes, the circuit board should be provided with contact bridges or bails that interrupt the connection between conductor strips or the like upon the melting of the solder material. For this purpose, the contact bridges are embodied in a spring-loaded or springy stressable manner, so that an automatic or self-actuating release of the connection arises through the respective contact bridge due to the provided spring force when the mechanical connection yields due to the softening of the solder. In that regard, the contact bridge includes a springing element that separates the contact bridge from the circuit board in a sudden jump-like manner as soon as the utilized solder falls below a minimum strength.

In that regard, the contact bridge could also be mounted through the use of other suitable materials or mechanical arrangements by which it is ensured that the physical connection of one of the terminals or contacts of the contact bridge is released and therewith this contact bridge can open while interrupting the current-side connection upon reaching or exceeding a prescribable minimum temperature. Preferably, at least a releasable contact of the contact bridge is mounted through the use of the solder that is used for mounting the components on the circuit board, so that the arising melting of the solder at sufficiently high temperatures can be utilized for triggering the safety or fuse function via the contact bridge. A fixed contact of the contact bridge may be additionally mechanically secured.

In order to ensure a reliable interruption, when needed, of the electrical connection established by the contact bridge between the respective conductor strips and/or components, the contact bridge is advantageously loaded with a sufficiently high spring force. For that purpose, the contact bridge can be loaded or impinged upon by an additional or separate allocated spring member such as a compression spring in an advantageous embodiment. This compression spring, especially embodied as a separate component, is advantageously adapted with respect to its dimensioning parameters, such as especially the spring force, the allocated spring travel, and the like, to the provided installation location and to the forces required for a reliable opening of the contact bridge in a case when needed.

In such an embodiment, the compression spring can especially be guided or passed through an allocated hole or a bore in the circuit board, whereby the compression spring is counter-supported preferably on a housing wall, for example a housing floor. In such a construction, the contact bridge can be mounted and soldered especially in a zero force or force-less manner and without pre-stressing while utilizing conventional SMD technologies, because no special additional forces must be applied for fixing the contact bridge during the mounting. In a subsequent mounting step, the compression spring that is counter-supported in the housing floor or a similar further component can then be guided or passed through the hole in the circuit board located under the contact bridge and mounted with a pre-stress.

Alternatively or additionally, the respective contact bridge is fabricated to be springy in itself and is mounted with an internal pre-stress. In such an embodiment, an especially simple construction is made possible, especially because no further separate components beyond the contact bridge are required. In that regard, the contact bridge can be embodied in such a manner so that it receives its internal pre-stressing already during the mounting. Alternatively however, in order to also be able to mount the contact bridge in a SMD technology without special provisions to hold the pre-stressed contact bridge in the pre-stressed condition during the soldering, the mounting of the contact bridge on the circuit board should be possible without additional clamping or stressing forces or the like. For that purpose, the contact bridge itself is advantageously fabricated to be springy and designed for a stress-free or unstressed solder mounting, and then an internal pre-stressing of the contact bridge is applied by a suitable deformation of the contact bridge after the contact bridge has been solder-mounted in the unstressed condition.

For an especially reliable safety or fuse function, the electronic assembly is advantageously designed in such a manner so that the current supply to the circuit board or to individual components is interrupted in a targeted manner upon the occurrence of an unexpected temperature increase, because thereby the power dissipation can be reduced especially effectively and quickly. In order to ensure this, at least one of the contact bridges is advantageously mounted on a supply conductor strip through which a current feed or supply to the components mounted on the circuit board is carried out.

For a production effort and expense that is held especially small, for producing the assembly, the components thereof and especially also the contact bridges are advantageously designed for a mountability with use of typical solder and mounting methods. In that regard, in order to especially make use of conventional and cost-advantageous mounting concepts, the or each contact bridge is advantageously configured in such a manner that it is insertable or mountable in an automated mounting process. For that purpose, the respective contact bridge is advantageously formed in such a manner that it can be supplied in a belted or magazined manner like per se known SMD components to a conventional automatic mounting machine or robot.

Due to the achievable high safety standard of the electronic assembly with respect to high power dissipation and damages caused thereby, such as destruction or disruption of the circuit board for example, the assembly is especially suitable for application in a motor vehicle. Advantageously, in that regard, the electronic assembly is used in an ABS (Antilock Braking System) or ESP (Electronic Stability Program) system of a motor vehicle.

Through the provision of spring-loaded contact bridges for providing electrical connections between conductor strips and/or components on the circuit board, the invention achieves the advantage that the electrical connection produced by the contact bridge is quickly and abruptly interruptable upon the occurrence of an increased temperature, which causes a melting or softening of the soldered connection location of the contact bridge to the circuit board, and therewith releases the contact bridge which then springs open due to its springy pre-stress and thereby interrupts the electrical connection. Thereby the energy supply to the circuit board in total or to individual components can be interrupted reliably, abruptly and quickly on the assembly, as soon as an unexpected temperature increase occurs. Thereby resultant damages due to increased power dissipation in the assembly are surely avoided.

BRIEF DESCRIPTION OF THE DRAWINGS

An example embodiment of the invention will be explained more closely in connection with the drawing. Therein:

FIG. 5a is a detail view in vertical section, of a stressable contact bridge similar to the embodiment on the right side of FIG. 2 as well as FIGS. 3a and 3b;

FIG. 5b is a bottom plan view of the arrangement in FIG. 5a at the view arrow VB;

FIG. 6 is a side view showing the contact bridge of FIG. 5a after it has been elastically deformed so as to apply a pre-stress; and FIG. 7 is a side view of the contact bridge of FIG. 6 after it has been thermally triggered and released.

DETAILED DESCRIPTION OF EXAMPLE EMBODIMENTS OF THE INVENTION

The same parts are provided with the same reference numbers in all figures.

Figure 1:
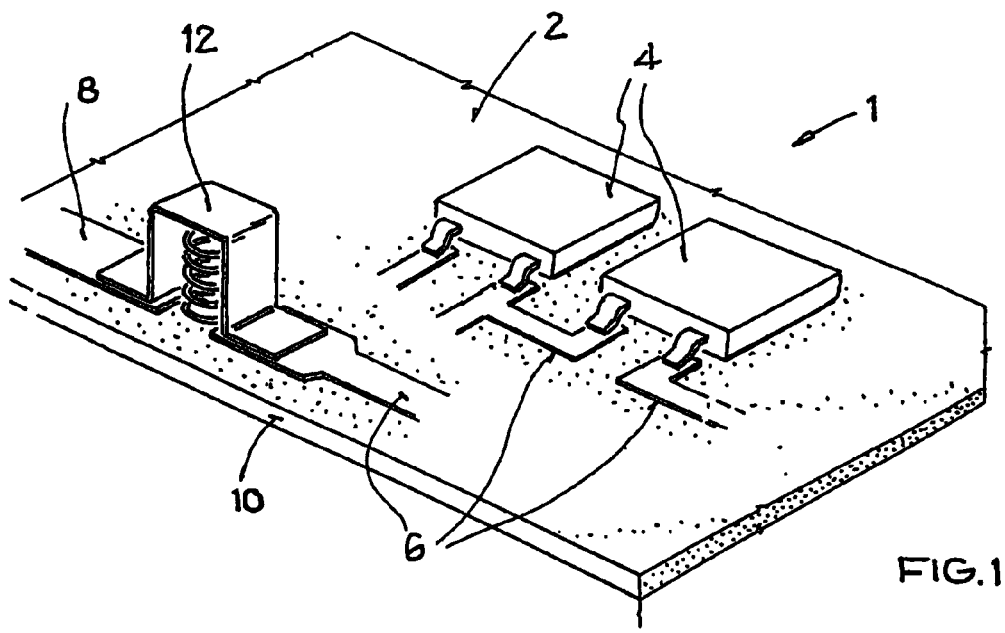
FIG. 1 schematically shows an electronic assembly.

The electronic assembly 1 schematically illustrated in FIG. 1 is especially provided for use in electronic control devices, such as for example in driving dynamics regulators, ABS regulators, ESP systems or other vehicle control devices of a motor vehicle. It encompasses a circuit board 2 that is equipped with a number is of application-specifically embodied SMD components 4 and further electronic and/or electromechanical elements. The SMD components 4 and if applicable the further elements are mounted on the circuit board 2 through use of a suitable solder and are suitably connected with one another via a plurality of conductor strips or paths 6, of which only a few are illustrated in an exemplary manner in the example embodiment.

In that regard, the circuit board 2 can be embodied as a simple or single circuit board or also as a circuit board with several wiring planes, such as for example a two-layer, four-layer or multi-layer circuit board. For supplying the active components with voltage and/or current, the circuit board 2 additionally comprises a number of conductor strips or paths 6 that are embodied as so-called supply conductor strips 8. These are especially embodied to be suitable for the connection of an external voltage supply. In view of this application purpose, the supply conductor strips 8 are suitably selected especially with respect to their material and their dimensioning.

Due to its design, the circuit board 2 is secured against a possible occurrence of high power dissipation. For this purpose, a number of connections between conductor strips 6, components 4 and/or the further elements is produced respectively via a spring-loaded contact bail or bridge 12, of which only one is illustrated in FIG. 1. Of course, still further contact bridges 12 can also be positioned at suitable locations of the circuit board 2 depending on the requirements, design and architecture of the assembly 1. The contact bridge 12 is mounted on the circuit board 2 through use of the solder that is also used for mounting the components 4 and the further elements. Thereby it is ensured that the strength of the connection of the contact bridge 12 with the circuit board 2 is gravely reduced upon the occurrence of temperatures of more than the melting temperature of this solder (for example about 180° C.). Through the loading is of the contact bridge 12 with a suitable pre-stress, in this case an abrupt or jump-like releasing of the contact bridge 12 from the circuit board 2 occurs when the solder at one or both of its connection points melts or is weakened, so that the connection established through the contact bridge 12 is instantaneously interrupted. In the example embodiment according to FIG. 1, in which the contact bridge 12 is circuit-connected in a supply conductor strip 8, in this case thereby the current supply of the circuit board 2 is directly interrupted, so that high power dissipation is immediately prevented.

Figure 2:
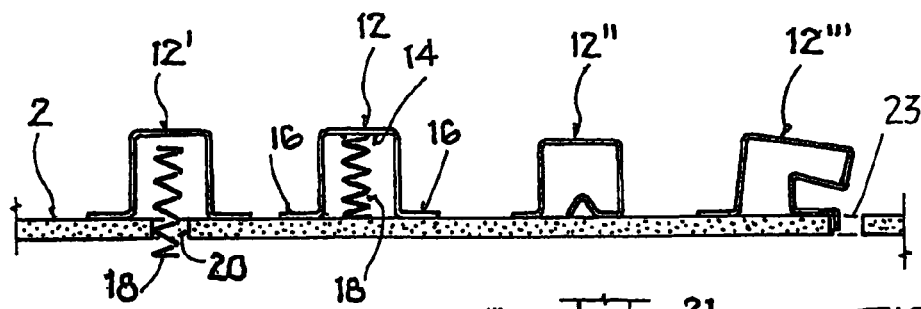
FIG. 2 shows four different embodiments of a circuit board of the assembly according to FIG. 1 in a longitudinal vertical section.

In the example embodiment according to FIG. 2, various different preferred variants for mounting the contact bridge 12 on the circuit board 2 are schematically illustrated. The contact bridge 12, which corresponds in its embodiment or design with that shown in FIG. 1, comprises a metallic base body 14 that is soldered at its connection points or ends 16 to the circuit board 2. A compression spring 18 is arranged within the base body 14, whereby the compression spring 18 is mounted under a pre-stress and braces itself on one side on the base body 14 and on the other side on the circuit board 2. Thereby, through the compression spring 18, a sufficiently dimensioned pre-stress is applied that will lead to a loosening or releasing of the base body 14 from the circuit board 2 in connection with a weakening of the connection of the ends 16 to the circuit board 2.

The second embodiment of a contact bridge 12' is similar in its embodiment or design to the first contact bridge 12, whereby in this case however, the compression spring 18 is guided or passed through an allocated hole 20 in the circuit board 2. Thereby the compression spring 18 can be installed so as to stress the contact bridge 12' after the contact bridge 12' has been solder-mounted in an unstressed condition.

The third alternative embodiment of the contact bridge 12'' is, in contrast, embodied in a one-piece manner so that the contact bridge 12'' is itself springy and stressable without use of a separate compression spring. In that regard, the contact bridge 12'' is formed of a springy base body 14 for example made of spring steel or any elastically deformable metal, which can be given a suitable internal pre-stress through its form or structure. In that regard, the contact bridge 12'' is suitably formed and pre-stressed already in the fabrication step, and is mounted under or with this pre-stress on the circuit board 2. Thus, the stressed condition of the contact bridge 12'' must be held while the soldering is carried out, because the stressed contact bridge 12'' tends to spring out of its solder-mounted configuration into a released configuration in which the internal spring stress is relieved.

In contrast, the fourth embodiment of a contact bridge 12''', which is similarly embodied in one-piece without further components and without an external compression spring, is initially fabricated in an unstressed or pre-stress-less manner. The unstressed contact bridge 12''' can thus be solder-mounted in an especially simple manner also with SMD technology, without requiring any special support or maintaining of a special stressed configuration. Subsequently, i.e. after it is mounted, the contact bridge 12''' is deformed for producing the desired spring loading or pre-stress, whereby for example a suitably positioned pressing die or stamp 21 can be utilized for deforming the contact bridge 12''' from an unstressed configuration to a stressed configuration as can be seen by comparing FIG. 3a with FIG. 2.

Figure 3A:
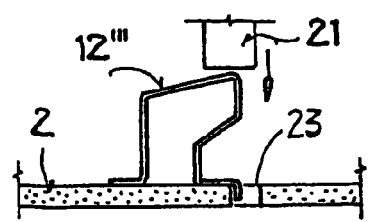
FIGS. 3a, 3b show a contact bridge of the circuit board according to two of the embodiments of FIG. 2 in a detail view.
Figure 3B:
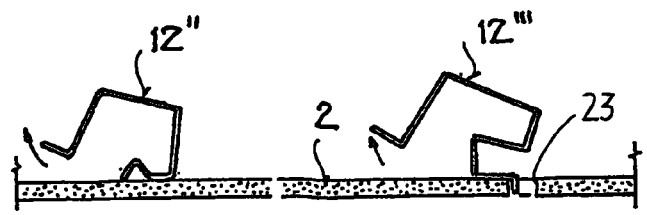

Further details of the variants of the contact bridge 12 are shown in FIGS. 3a, 3b and 4. FIG. 3a shows the fourth contact bridge 12''' in its initial unstressed configuration directly before or directly after its solder-mounting on the circuit board 2. Namely, the contact bridge 12''' is about to be secured or is already secured by solder on the circuit board 2, but still comprises its un-deformed basic original shape, i.e. its unstressed configuration. In this condition, the contact bridge 12''' can be soldered onto the circuit board 2 without pre-stress and correspondingly without any significant external forces. This makes the soldering operation simple and straightforward. In order to thereafter impress onto the contact bridge 12''' the pre-stress that is desired for the safety or fuse purposes, the contact bridge 12''' is suitably deformed by a pressing die or stamp 21, which moves downwardly in the direction of the illustrated arrow for example, to deform the contact bridge 12''' from its initial unstressed configuration as shown in FIG. 3a to its stressed configuration as shown in FIG. 2.

In contrast, FIG. 3b shows the contact bridges 12'' and 12''' after the case of triggering, i.e. after undesirably high temperatures have arisen. This leads to the start of melting of the solder with which the contact bridges 12'', 12''' are respectively fixed on the circuit board 2. As a result of the pre-stress impressed on the respective contact bridge, the softened or melted solder connection can no longer securely hold the stressed contact bridge against the elastic pre-stress force, so that the contact bridge 12'', 12''' releases in an abrupt jump-like manner and interrupts the electrical connection established by it.

Figure 4A:
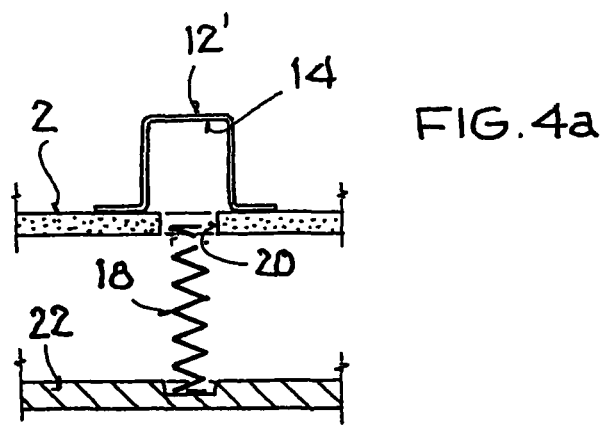
FIGS. 4a to 4c respectively show several embodiments of a spring-loaded contact bridge or circuit component in partial views.

FIG. 4a shows the contact bridge 12' according to the second embodiment after it has been solder-mounted and directly before the final assembly of the housing of the electronic assembly. As can be seen in FIG. 4a the base body 14 of the contact bridge 12' has been mounted in a pre-stress-less i.e. unstressed manner by soldering on the circuit board 2, so that this can especially be carried out with conventional SMD mounting methods. Subsequently the compression spring 18 is passed through the hole 20 in the circuit board 2 during the assembly process. In that regard, the compression spring 18 is counter-supported on a housing wall 22, for example a housing floor. Thus, by setting the circuit board 2 onto the housing wall 22, the compression spring 18 is brought into contact with the base body 14 of the contact bridge 12', so that the contact bridge 12' is thereby spring-loaded or pre-stressed.

Figure 4B:
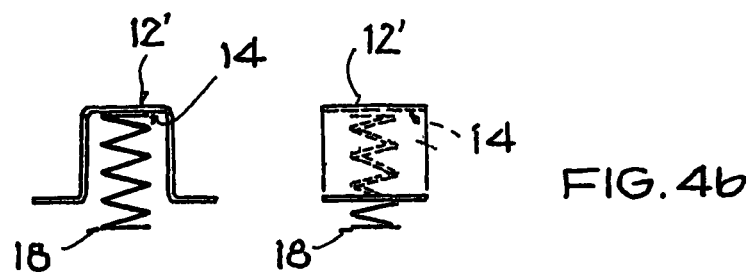
Figure 4C:
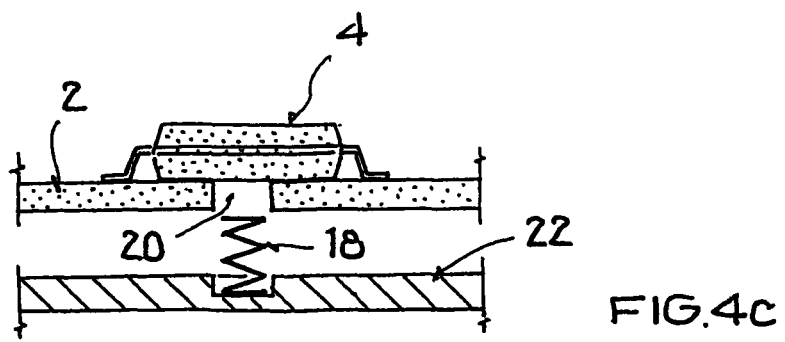

In FIG. 4b, the second embodiment contact bridge 12' is shown in a partial view in a mounted condition in side and front views. Thereby it can be recognized that the compression spring 18 lies bears against the upper surface of the base body 14 in the final mounted condition.

Fundamentally, the safety or fuse function with respect to increased temperatures achieved by the spring-loading or use of a pre-stressed compression spring 18 bearing on a contact bridge can also be achieved basically analogously by a corresponding spring-loaded mounting of an electronic or electromechanical component. This is shown by way of example in FIG. 4c. There an SMD component 4 is mounted with use of a suitable solder on the upper surface of the circuit board 2. Also here a compression spring 18 is guided or passed through an allocated hole 20 in the circuit board 2, and is counter-supported on a housing wall 22 so as to press against and thereby spring-load the component 4. Through the thusly achieved spring-loaded mounting of the SMD component 4, this component will thus be lifted away from the circuit board 2 in the case of a temperature increase that causes a softening of the solder, so that the circuit and thus the current supply to the component 4 is interrupted.

FIGS. 5a, 5b, 6 and 7 show further details of an embodiment of the springy stressable contact bridge corresponding to the fourth embodiment contact bridge 12''' as shown in the right side of FIG. 2 as well as FIGS. 3a and 3b. In comparison to the above discussed figures, additional details are shown and described in connection with FIGS. 5a, 5b, 6 and 7.

FIG. 5a shows the springy stressable contact bridge 32 after it has been mounted on the circuit board 2 in an unstressed condition, and before it has an internal pre-stress applied thereto by being elastically deformed as will be discussed below. The contact bridge 32 is a one-piece component made of an elastically deformable metal, for example by stamping and inelastic deformation or bending. Particularly, the metal is bent to have a shape shown in the vertical section side view of FIG. 5a, as a preferred shape in the present example embodiment. Other shapes are also possible, as long as they allow for an elastic deformation of the contact bridge that imposes an internal pre-stress on the contact bridge.

With the preferred shape as shown, the contact bridge 32 includes a releasable leg 32A and a fixed leg 32B at the opposite ends of the contact bridge 32. The contact bridge 32 further includes, in succession, an upright shank 32C, a top web 32D, a face shank 32E, a chin shank 32F, and a neck shank 32G, connecting the releasable leg 32A and the fixed leg 32B to one another. These first, second and third shanks 32E, 32F and 32G are named the face shank, the chin shank, and the neck shank respectively simply as reference names, because the profile shape of the contact bridge 32 looks somewhat like the face or head profile of a person. In the unstressed condition of the contact bridge 32 when it is first mounted on the circuit board 2 as shown in FIG. 5a, the releasable leg 32A and the fixed leg 32B extend substantially horizontally parallel to a base plane or reference plane defined by the circuit board 2 which is regarded as extending horizontally for reference. The upright shank 32C, the face shank 32E and the neck shank 32G extend substantially vertically +/−10° in this unstressed condition. The top web 32D extends substantially horizontally +/−10° (preferably parallel to the base reference plane within +/−2° or more preferably +/−1°), and the chin shank 32F extends sloping diagonally from the face shank 32E to the neck shank 32G.

In the initial mounted condition shown in FIG. 5a, the contact bridge 32 has been placed on the circuit board 2, for example using standard SMD mounting equipment such as a pick and place device that uses a suction nozzle to suck and hold the contact bridge 32, for example with suction applied conveniently to the flat top surface of the top web 32D or to the flat top surface of the releasable leg 32A. The configuration of the contact bridge 32 also easily allows a plurality of such contact bridges to be arranged in succession along a supply feeder tape or in a magazine of the pick and place device, or the like.

Once the contact bridge 32 has been placed into the proper position on the circuit board 2, it is mounted by soldering at the appropriate locations, for example using any conventional soldering process, especially any soldering process typically used for SMD mounting of components, for example a reflow soldering process. In the example shown in FIG. 5a, the releasable leg 32A of the contact bridge 32 is soldered independently to a first solder contact pad 33A and to a second solder contact pad 33B. The releasable leg 32A establishes an electrical conduction path between the two solder contact pads 33A and 33B, thereby completing a circuit between these two solder contact pads. For example, this circuit may be a current supply path along a supply conductor strip 8 or along any other conductor trace or conductor strip 6 of the circuit arrangement. Additionally, but optionally, or as an alternative to the second solder contact pad 33B on the releasable leg 32A, the fixed leg 32B of the contact bridge 32 may be soldered to a solder mounting pad or contact pad 34 of the circuit board 2. This mounting pad 34 may simply be an isolated mounting location for solder-mounting the contact bridge 32 to the circuit board 2, or it may also be a terminal or contact pad of a conductor strip 6 or supply conductor strip 8. In this case, the releasable leg 32A may be soldered to only a single contact pad 33A or 33B, or it could be soldered to both pads 33A and 33B, whereby the contact bridge 32 then establishes an electrical conduction path between or among all of the soldered pads 34, 33A and/or 33B. Thus, an electrical current can then flow from the contact pad 34 through the fixed leg 32B and then the successive shanks, top web and releasable leg 32A of the contact bridge 32 which provides conduction to the contact pad 33A and/or 33B.

In the initial mounted condition of the contact bridge 32 shown in FIG. 5a, the contact bridge 32 is unstressed or stress-free. Therefore, the contact bridge does not need to be held or supported to maintain the illustrated shape while it is being solder-mounted onto the circuit board 2. After the soldering is completed, the contact bridge 32 is then elastically deformed so as to apply an internal pre-stress that exerts a spring force upwardly on the releasable leg 32A, so as to cause a tendency of the releasable leg 32A to pull upwardly away from the contact pads 33A and 33B. This pre-stressing of the contact bridge 32 is achieved by pressing downwardly on the contact bridge 32 with a pressing die or stamp 21, or particularly a specialized pre-stressing tool 21' with a special configuration as represented in FIG. 5a. When the pre-stressing tool 21' is moved downwardly in the direction of arrow 21" it makes contact with the two upper corners of the contact bridge 32 at the edges of the top web 32D, and causes these corners to ride or slide along sloping surfaces of the tool 21', so as to elastically flex the upright shank 32C while bending down the chin shank 32F and causing the top web 32D to tilt or slope downwardly, into the configuration shown in FIG. 6. In effect, the head-shaped profile of the contact bridge 32 has been tilted and pressed downwardly so as to nod or bow down the head-shaped profile, while elastically flexing the upright shank 32C into a sloping curved shape. In the deformed pre-stressed configuration shown in FIG. 6, it is preferred that the top web 32D slopes downwardly from a top end of the upright shank 32C, the first or face shank 32E slopes downwardly in an opposite direction from the top web 32D, the second or chin shank 32F extends from the first shank 32E toward the upright shank 32C substantially parallel within ±10° relative to the base reference plane, and the third or neck shank 32G extends from the second shank 32F to the fixed leg 32B substantially perpendicular within ±10° relative to the base reference plane.

The above deforming of the contact bridge 32 exerts an elastic flexing force through the upright shank 32C onto the releasable leg 32A, which tends to urge the releasable leg 32A upwardly. Thus, in the configuration shown in FIG. 6, the contact bridge 32 has been pre-stressed with an internal stress as described above, whereby the contact bridge 32 is activated to be able to carry out its fuse function. Namely, in the condition of FIG. 6, the circuit arrangement including the contact bridge 32 is ready to be put into use.

FIG. 7 shows a triggered condition of the contact bridge 32 having operated as a thermal fuse or overcurrent protection fuse. Namely, during operation of the circuit arrangement, if an unacceptably high temperature above a selected trigger temperature arises at the solder contact pads 33A and 33B, the solder at these locations softens and is then no longer able to withstand the upward deflecting or pulling force exerted on the releasable leg 32A by the other portions, e.g. the elastically flexed upright shank 32C, of the contact bridge 32. As a result, the releasable leg 32A is released and abruptly springs upwardly away from the solder contact pads 33A and 33B, thereby interrupting the circuit connection between these contact pads.

The excessive temperature arising at the solder pads can be from various sources or causes. Most importantly, the solder pads 33A and 33B are preferably thermally coupled, e.g. via a metal thermal conduction layer or strip in the circuit board 2, to one or more electronic components 4 mounted on the circuit board 2 or an adjoining circuit board. Thereby, if one of the components overheats, e.g. due to a malfunction causing excessive current draw, the excess heat will be conducted to the solder pads 33A and 33B and thereby trigger the fuse function of the contact bridge 32. Also, the excessive temperature at the solder pads 33A and 33B can be the result of an excessive current flowing directly through the contact pads 33A and 33B via the releasable leg 32A of the contact bridge 32. If the mounting pad 34 is not a current-carrying pad, and the current conduction is only between the two contact pads 33A and 33B via the releasable leg 32A, this helps to ensure that an excessive temperature arising due to an overcurrent flow through the releasable leg 32A will cause a softening of the solder holding the releasable leg 32A before the solder of the fixed leg 32B softens. Alternatively, if the contact pad 34 is also used as a circuit conduction path contact, then the excessive current may be flowing among the contact pads 33A, 33B and 34 through the entire contact bridge 32 including the releasable leg 32A as well as the fixed leg 32B. Furthermore, the excessive temperature can be the result of externally imposed heat, for example due to a fire involving the circuit arrangement, or due to an excessive external environmental temperature.

In any event, if the excessive temperature condition affecting the contact pads 33A and 33B also affects the contact pad or mounting pad 34, then the solder mounting joint at this pad 34 may also become softened. That could lead to problems if the softened mounting joint at the pad 34 allows the fixed leg 32B to pull up away from the mounting pad 34 due to the pre-stress of the elastic springy contact bridge 32. In such a case, the contact bridge 32 would not be held or braced so as to ensure the abrupt upward release of the releasable leg 32A. Instead, both the releasable leg 32A as well as the fixed leg 33B might come loose from their respective mounting pads without actually springing upwardly so as to interrupt the electrical conduction path. To avoid such a problem, the fixed leg 32B of the contact bridge 32 is additionally fixed or secured as follows.

One manner of ensuring that the fixed leg 32B remains fixed while the releasable leg 32A is released when an excess temperature arises, is to use a solder with a higher melting temperature for solder-mounting the fixed leg 32B onto the mounting pad 34, in comparison to a lower melting temperature solder for soldering the releasable leg 32A onto the contact pads 33A and 33B. As a result, the releasable leg 32A would already be released at a lower temperature than a temperature at which the solder on the mounting pad 34 would begin to soften. Such use of two different solders, however, complicates the soldering process for mounting the contact bridge 32.

It is thus preferred to mechanically fix or secure the fixed leg 32B to the circuit board 2 in a form-locking or shape-engaging manner. To achieve the form-locking or shape-engaging mechanical connection of the fixed leg 32B to the circuit board 2, the fixed leg 32B is further provided with a fixing tab, and the circuit board 2 is provided with a mounting fixture that is engaged by the fixing tab. Particularly, this engagement is to prevent a sliding motion of the fixed leg 32B along the plane of the substrate 2, as well as a tilting or pivoting motion of the fixed leg 32B pivoting upwardly away from the circuit board 2 at the free end of the fixed leg 32B. In the preferred embodiment shown in FIGS. 5a, 5b, 6 and 7, the fixing tab comprises a mounting pin or fixing pin 32H that is formed as a unitary monolithic one-piece component of the contact bridge 32. In this regard, the fixing pin 32H extends integrally from the outer free end of the fixed leg 32B, and is bent downwardly substantially perpendicularly from the fixed leg 32B, preferably at 91°±/−1° from the horizontal reference plane under the contact bridge.

Further in the illustrated preferred embodiment, the mounting fixture provided for or on the circuit board 2 comprises a mounting hole 23 in the circuit board 2. The fixing pin 32H is simply inserted into the mounting hole 23 during the placement of the contact bridge onto the circuit board to achieve the desired form-locking or shape-engaging connection of the fixed leg 32B to the circuit board 2. To hold the fixing pin 32H in the mounting hole 23 with sufficient fitting precision, the fixing pin 32H preferably has a horseshoe-shaped or U-shaped horizontal section as shown in FIG. 5b, including two pin flanges 32J extending from a pin back 32I. Thus, the pin back 32I forms the base web and the two flanges 32J form the legs or shanks of the horseshoe shape or U-shape, which fits into the clear open diameter of the mounting hole 23 in the circuit board 2 with the appropriate degree of tolerance or clearance. There does not need to be an absolutely tight friction fit, but rather there can be some clearance play. The horseshoe or U-shape also allows the two pin flanges 32J to deflect elastically laterally inwardly so as to facilitate the insertion of the fixing pin 32H into the mounting hole 23, and optionally to ensure a friction fit of the pin into the hole. Preferably, for example, the hole 23 has a diameter of 0.9 mm (tolerance+0.05 mm), and the cross-sectional shape of the pin 32H has a length of the U-shape being 0.7 mm (tolerance+0.04 mm) and a width of the U-shape being 0.7 mm (tolerance−0.1 mm). The fit merely needs to be close or tight enough to keep the pin in the hole so as to prevent a is horizontal sliding and an upward pivoting motion of the fixing pin 32H and the fixed leg 32B due to the internal elastic stress of the contact bridge 32.

The preferred embodiment as illustrated is very advantageous, because the downwardly extending fixing pin 32H can be easily inserted into the mounting hole 23 during the process of placing the contact bridge 32 onto the circuit board 2. It is simply necessary to align the contact bridge 32 in the proper position and registration relative to the circuit board 2, and then move the contact bridge 32 toward the circuit board 2 in a direction perpendicular to the circuit board, e.g. in the direction of motion arrow 21", for example using a standard automated pick and place tool that mounts components on the circuit board in a generally conventional manner. Also, the insertion of the fixing pin 32H into the mounting hole 23 is facilitated by the tapered bottom edges 32K of the two pin flanges 32J, as can be seen in the side vertical section view of FIG. 5a. These tapered bottom edges help the fixing pin 32H "find" and slide into the mounting hole 23 during the insertion process.

Nonetheless, other configurations of the fixing tab and the mounting fixture are possible as well. It is simply required that a component provided on the fixed leg of the contact bridge has a configuration that mates, engages or locks with a configuration of a mounting fixture provided on the circuit board 2.

The mechanical engagement of the fixed leg 32B to the circuit board 2 thus supports or supplements the soldered connection of the fixed leg 32B onto the mounting pad 34. Moreover, the soldered connection on the mounting pad 34 can be entirely omitted if the mechanical engagement of the fixing pin 32H in the mounting hole 23 is sufficiently secure. In any event, the mechanical engagement provided for the fixed leg 32B, together with the solder connection on the mounting pad 34, or even without the solder connection on the mounting pad 34, ensures that the internal elastic spring force of the pre-stressed contact bridge 32 as shown in FIG. 6 will cause an abrupt springing release of the releasable leg 32A from the contact pads 33A and 33B when an excessive temperature condition causes the solder connections on the contact pads 33A and 33B to soften or melt. The releasable leg 32A will pivot upwardly away from the contact pads 33A and 33B under the influence of the elastic stress of the contact bridge 32, while the fixed leg 32B remains held on the circuit board by the engagement of the fixing pin 32H into the mounting hole 23, as shown in FIG. 7.

Still further it should be understood that the circuit board 2 simply refers to or represents any mounting substrate to carry the contact bridge and at least two contact pads, for the spring-loaded or springy contact bridge to function as a thermal fuse or an overcurrent fuse. For example, this "circuit board" can be a base of a fuse housing in which the contact bridge and at least two contact terminals are enclosed to manufacture an individual packaged fuse component, which can then be installed in various other circuit arrangements and assemblies.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

The invention claimed is:

1. An electrical assembly comprising:
a substrate with a mounting fixture;
a metal contact bridge that is arranged on said substrate and that includes a releasable leg, a fixed leg, an elastically stressed body that includes at least one elastically stressed shank and that connects said releasable leg with said fixed leg, and a fixing tab connected to said fixed leg, wherein said fixing tab is mechanically engaged by a mechanical connection with said mounting fixture to mechanically hold said fixed leg on said substrate;
a first soldering pad adjacent to said releasable leg; and
first solder forming a first solder joint that connects and holds said releasable leg on said first soldering pad, whereby an elastic stress of said elastically stressed body acts on said releasable leg so as to urge said releasable leg away from said first soldering pad and away from said substrate;
wherein said first solder is adapted to soften at and above a trigger temperature such that said first solder joint will release said releasable leg and said releasable leg will move away from said first soldering pad under influence of the elastic stress of said elastically stressed body; and
wherein said mechanical connection comprises a first configuration of said fixing tab form-locking or shape-engaging with a second configuration of said mounting fixture.

2. The electrical assembly according to claim 1, wherein said substrate comprises a circuit board, and wherein said electrical assembly further comprises at least one electronic or electromechanical component mounted on said circuit board, and a conductor track that is arranged on said circuit board and connects a terminal of said component to said first soldering pad.

3. The electrical assembly according to claim 1, further comprising a power-dissipating electronic or electromechanical component that is electrically and thermally conductively connected to said first soldering pad, such that an excessive power dissipation in said component will cause a temperature equal to or greater than the trigger temperature at said first soldering pad.

4. The electrical assembly according to claim 1, wherein said releasable leg is held toward said substrate against the elastic stress of said elastically stressed body only by one or more solder joints including said first solder joint.

5. The electrical assembly according to claim 1, wherein at least a part of said fixing tab having said first configuration extends substantially perpendicular within ±2° relative to a plane defined by said substrate and is mechanically engaged in a receiving part of said mounting fixture having said second configuration.

6. The electrical assembly according to claim 1, wherein said mechanical connection mechanically engages said fixing tab with said mounting fixture sufficiently firmly so as to prevent said fixed leg from sliding parallel along said substrate and to prevent said fixed leg from pivoting away from said substrate under influence of the elastic stress of said elastically stressed body.

7. The electrical assembly according to claim 1, wherein said mounting fixture comprises a hole having said second configuration in said substrate, said fixing tab comprises a fixing pin having said first configuration, and said fixing pin is inserted in said hole to form said mechanical connection that mechanically engages said fixing tab with said mounting fixture.

8. The electrical assembly according to claim 1, wherein said first configuration comprises a male shape of said fixing tab that fits into said second configuration which comprises a female shape of said mounting fixture to form said mechanical connection that mechanically engages said fixing tab with said mounting fixture.

9. The electrical assembly according to claim 1, wherein said electrical assembly is a packaged thermal protection fuse, said substrate is a package base, and said electrical assembly further comprises a package housing in which said contact bridge, said first soldering pad, and said solder are enclosed on said package base.

10. The electrical assembly according to claim 1, wherein said electrical assembly is an ABS or ESP electronics module for a motor vehicle, said substrate is a circuit board and said assembly further comprises at least one electronic component mounted on said circuit board and connected to said first soldering pad by a conductor track, and a housing in which said circuit board is enclosed.

11. The electrical assembly according to claim 1, wherein said mechanical connection is a solderless joint.

12. The electrical assembly according to claim 1, wherein there is no soldered joint connection between said fixing tab and said mounting fixture.

13. A method of fabricating and activating the electrical assembly according to claim 1, comprising steps:
a) mechanically engaging said fixing tab with said mounting fixture;
b) positioning said releasable leg adjacent to said first soldering pad;
c) after said step b), in a state with no tensile stress between said releasable leg and said first soldering pad, performing a soldering operation with said first solder to form said first solder joint;
d) after said step c), activating said electrical assembly such that said elastic stress of said elastically stressed body urges said releasable leg away from said first soldering pad, but said releasable leg is held to said first soldering pad by said first solder joint.

14. The method according to claim 13, wherein said activating comprises deforming said metal contact bridge so as to establish said elastic stress of said elastically stressed body.

15. An electrical assembly comprising:
a substrate with a mounting fixture;
a metal contact bridge that is arranged on said substrate and that includes a releasable leg, a fixed leg, an elastically stressed body that includes at least one elastically stressed shank and that connects said releasable leg with said fixed leg, and a fixing tab connected to said fixed leg, wherein said fixing tab is mechanically engaged with said mounting fixture to mechanically hold said fixed leg on said substrate;
a first soldering pad adjacent to said releasable leg; and
first solder forming a first solder joint that connects and holds said releasable leg on said first soldering pad, whereby an elastic stress of said elastically stressed body acts on said releasable leg so as to urge said releasable leg away from said first soldering pad and away from said substrate;
wherein said first solder is adapted to soften at and above a trigger temperature such that said first solder joint will release said releasable leg and said releasable leg will move away from said first soldering pad under influence of the elastic stress of said elastically stressed body;
further comprising a second soldering pad adjacent to said releasable leg and separated from said first soldering pad, and a second solder forming a second solder joint that connects and holds said releasable leg to said second soldering pad, wherein said releasable leg completes an electrical circuit path between said first soldering pad and said second soldering pad.

16. The electrical assembly according to claim 15, wherein said first soldering pad and said second soldering pad are both arranged on said substrate, and said electrical assembly further comprises a first conductor track arranged on said substrate and connected to said first soldering pad and a second conductor track arranged on said substrate and connected to said second soldering pad.

17. The electrical assembly according to claim 15, further comprising a third soldering pad arranged on said substrate adjacent to said fixed leg, and a third solder forming a third solder joint that connects and holds said fixed leg on said third soldering pad.

18. The electrical assembly according to claim 17, wherein said third soldering pad is electrically isolated on said substrate.

19. The electrical assembly according to claim 17, further comprising three conductor tracks on said substrate, wherein said first soldering pad, said second soldering pad and said third soldering pad are respectively individually connected to said three conductor tracks, and said contact bridge electrically interconnects said first soldering pad, said second soldering pad and said third soldering pad.

20. The electrical assembly according to claim 17, wherein said first solder and said second solder both consist of a first solder material, and said third solder consists of another solder material that is different from said first solder material and that has a softening temperature higher than said trigger temperature.

21. An electrical assembly comprising:
a substrate with a mounting fixture;
a metal contact bridge that is arranged on said substrate and that includes a releasable leg, a fixed leg, an elastically stressed body that includes at least one elastically stressed shank and that connects said releasable leg with said fixed leg, and a fixing tab connected to said fixed leg, wherein said fixing tab is mechanically engaged by a mechanical connection with said mounting fixture to mechanically hold said fixed leg on said substrate;
a first soldering pad adjacent to said releasable leg;
first solder forming a first solder joint that connects and holds said releasable leg on said first soldering pad, whereby an elastic stress of said elastically stressed body acts on said releasable leg so as to urge said releasable leg away from said first soldering pad and away from said substrate, wherein said first solder is adapted to soften at and above a trigger temperature such that said first solder joint will release said releasable leg and said releasable leg will move away from said first soldering pad under influence of the elastic stress of said elastically stressed body; and
another soldering pad arranged on said substrate adjacent to said fixed leg and another solder forming another solder joint that connects and holds said fixed leg on said another soldering pad, wherein said another solder joint is in addition to and distinct from said mechanical connection by which said fixing tab is mechanically engaged with said mounting fixture, and wherein said contact bridge electrically connects said first soldering pad with said another soldering pad.

22. An electrical assembly comprising:
a substrate with a mounting fixture;
a metal contact bridge that is arranged on said substrate and that includes a releasable leg, a fixed leg, an elastically stressed body that includes at least one elastically stressed shank and that connects said releasable leg with said fixed leg, and a fixing tab connected to said fixed leg, wherein said fixing tab is mechanically engaged with said mounting fixture to mechanically hold said fixed leg on said substrate;
a first soldering pad adjacent to said releasable leg; and
first solder forming a first solder joint that connects and holds said releasable leg on said first soldering pad, whereby an elastic stress of said elastically stressed body acts on said releasable leg so as to urge said releasable leg away from said first soldering pad and away from said substrate;
wherein said first solder is adapted to soften at and above a trigger temperature such that said first solder joint will release said releasable leg and said releasable leg will move away from said first soldering pad under influence of the elastic stress of said elastically stressed body;
wherein said elastically stressed shank of said elastically stressed body is an upright shank that extends upwardly from said releasable leg relative to a base plane defined by said substrate;
wherein said elastically stressed body further includes a top web, a first shank, a second shank and a third shank connected in succession from said upright shank to said fixed leg; and
wherein said top web slopes downwardly from a top end of said upright shank, said first shank slopes downwardly in an opposite direction from said top web, said second shank extends from said first shank toward said upright shank substantially parallel within ±10° relative to said base plane, and said third shank extends from said second shank to said fixed leg substantially perpendicular within ±10° relative to said base plane.

23. The electrical assembly according to claim 22, wherein said contact bridge including said releasable leg, said elastically stressed body and said fixed leg is a single one-piece monolithic member of bent elastically springy metal.

24. The electrical assembly according to claim 22, wherein said upright shank extends sloping upwardly from said releasable leg and has an elastically deflected curved profile shape.

25. An electrical assembly comprising:
a substrate with a mounting fixture;
a metal contact bridge that is arranged on said substrate and that includes a releasable leg, a fixed leg, an elastically stressed body that includes at least one elastically stressed shank and that connects said releasable leg with said fixed leg, and a fixing tab connected to said fixed leg, wherein said fixing tab is mechanically engaged with said mounting fixture to mechanically hold said fixed leg on said substrate;
a first soldering pad adjacent to said releasable leg; and
first solder forming a first solder joint that connects and holds said releasable leg on said first soldering pad, whereby an elastic stress of said elastically stressed body acts on said releasable leg so as to urge said releasable leg away from said first soldering pad and away from said substrate;
wherein said first solder is adapted to soften at and above a trigger temperature such that said first solder joint will release said releasable leg and said releasable leg will move away from said first soldering pad under influence of the elastic stress of said elastically stressed body;
wherein said mounting fixture comprises a hole in said substrate, said fixing tab comprises a fixing pin, and said fixing pin is inserted in said hole to mechanically engage said fixing tab with said mounting fixture;
wherein said fixing pin includes a pin back extending from said fixed leg, and two pin flanges extending laterally from said pin back, such that said pin flanges and said pin back together form a horseshoe-shaped or U-shaped cross-sectional configuration of said fixing pin.

26. An electrical assembly comprising:
a substrate with a mounting fixture;
a metal contact bridge that is arranged on said substrate and that includes a releasable leg, a fixed leg, an elastically stressed body that includes at least one elastically stressed shank and that connects said releasable leg with said fixed leg, and a fixing tab connected to said fixed leg, wherein said fixing tab is mechanically engaged by a mechanical connection with said mounting fixture to mechanically hold said fixed leg on said substrate;
a first soldering pad adjacent to said releasable leg; and
first solder forming a first solder joint that connects and holds said releasable leg on said first soldering pad, whereby an elastic stress of said elastically stressed body acts on said releasable leg so as to urge said releasable leg away from said first soldering pad and away from said substrate;
wherein said first solder is adapted to soften at and above a trigger temperature such that said first solder joint will release said releasable leg and said releasable leg will move away from said first soldering pad under influence of the elastic stress of said elastically stressed body;
wherein said mechanical connection comprises a feature selected from the group consisting of a first feature wherein said mechanical connection comprises a friction fit between said fixing tab and said mounting fixture, and a second feature wherein said mechanical connection is not absolutely fixed but rather allows some clearance play between said fixing tab and said mounting fixture.

27. The electrical assembly according to claim 26, wherein said mechanical connection comprises said first feature.

28. The electrical assembly according to claim 26, wherein said mechanical connection comprises said second feature.

* * * * *

UNITED STATES PATENT AND TRADEMARK OFFICE
CERTIFICATE OF CORRECTION

| | | |
|---|---|---|
| PATENT NO. | : 8,665,057 B2 | Page 1 of 1 |
| APPLICATION NO. | : 12/899941 | |
| DATED | : March 4, 2014 | |
| INVENTOR(S) | : Schlenker et al. | |

It is certified that error appears in the above-identified patent and that said Letters Patent is hereby corrected as shown below:

In the Specification

Column 4,
Line 28, after "number", delete "is";
Line 63, after "loading", delete "is";

Column 6,
Line 39, after "lies", insert --and--;

Column 10,
Line 30, after "prevent a", delete "is".

Signed and Sealed this
Twenty-third Day of September, 2014

Michelle K. Lee
*Deputy Director of the United States Patent and Trademark Office*